United States Patent [19]
Heimburger et al.

[11] Patent Number: 5,490,094
[45] Date of Patent: Feb. 6, 1996

[54] METHOD AND APPARATUS FOR NOISE REDUCTION

[75] Inventors: Catherine Heimburger; Michael Knee, both of Strasbourg, France

[73] Assignee: Thomson Consumer Electronics, S.A., Courbevoie, France

[21] Appl. No.: 121,103

[22] Filed: Sep. 14, 1993

[30] Foreign Application Priority Data

Sep. 14, 1993 [FR] France .................. 92402502.6

[51] Int. Cl.$^6$ .................................... H04B 15/00
[52] U.S. Cl. ............... 364/574; 364/724.01; 364/825; 358/340; 348/607; 333/166
[58] Field of Search .................. 364/574, 724.01, 364/825, 581, 582, 575, 724.19; 358/340, 501; 348/606, 607; 333/166, 167, 176; 382/54, 41

[56] References Cited

U.S. PATENT DOCUMENTS

| | | | |
|---|---|---|---|
| 4,038,536 | 7/1977 | Feintuch | 235/152 |
| 4,303,943 | 12/1981 | May | 358/167 |
| 4,334,244 | 6/1982 | Chan et al. | 358/166 |
| 4,573,070 | 2/1986 | Cooper | 358/36 |
| 4,581,641 | 4/1986 | Turner | 358/167 |
| 4,682,230 | 7/1987 | Perlman et al. | 358/167 |
| 4,761,819 | 8/1988 | Denison et al. | 382/54 |
| 4,896,285 | 1/1990 | Ishikawa et al. | 364/724.01 |
| 4,928,258 | 5/1990 | May | 364/724.17 |
| 5,001,563 | 3/1991 | Doyle et al. | 358/140 |
| 5,136,529 | 8/1992 | Makie et al. | 364/581 |
| 5,148,278 | 9/1992 | Wischerman | 358/167 |
| 5,260,783 | 11/1993 | Dixit | 358/136 |
| 5,278,638 | 1/1994 | Nakada et al. | 358/36 |
| 5,387,946 | 2/1995 | Knee | 348/622 |
| 5,414,472 | 5/1995 | Hwang | 348/616 |

OTHER PUBLICATIONS

Christopher et al., "A VLSI Median Filter For Impulse Noise Elimination in Composite or Component TV Signals", IEEE, Trans on Cons. Elect. Feb. 1988 pp. 262–267.

Vassiliou et al., "On the Application of Averaging Median Filters in Remote Sensing," IEEE Trans. on GeoScience, Nov. 1988.

Signal Processing. European Journal Devoted to the Methods and Applications of Signal Processing, vol. 20, No. 1, May 1990, amsterdam nl., pp. 3–14: Unser "Improved Restoration of Noisy Images by Adaptive Least–Squares Post–Filtering".

IEEE Transactions on Acoustics, Speech, and Signal Processing vol. 37, No. 8, Aug. 1989, N.Y. US pp. 1293–1298: Kundu et al. "Double Window Hodges–Lehman (D) Filter and Hybrid D–Median Filter for Robust Image Smoothing".

Primary Examiner—Emanuel T. Voeltz
Assistant Examiner—Patrick J. Assouad
Attorney, Agent, or Firm—Joseph S. Tripoli; Peter M. Emanuel; Richard G. Coalter

[57] ABSTRACT

A noisy input signal x is filtered with a restoration filter of median type to generate a filtered input signal y. The sum of the absolute differences between filtered and unfiltered signal is calculated for each position of a sliding window within the input signal representing a local estimate of the noise, and is combined with a global measure of the input signal noise to compute two coefficients a and b which are respectively applied to the unfiltered and filtered signal to generate the output signal $z=a*x+b*y$ which is both globally and locally adapted to the structure of displayed images. Advantageously different kinds of filters operate in parallel, whereby the kind of filter elected is locally adapted to the picture activity.

23 Claims, 3 Drawing Sheets

METHOD AND APPARATUS FOR NOISE REDUCTION

FIELD OF THE INVENTION

This invention relates to electrical filters and particularly to filters for providing noise reduction.

BACKGROUND OF THE INVENTION

Different kinds of video noise filters are known. M. Unser, "Improved restoration of noisy images by adaptive least-squares post-filtering", Signal Processing 20 (1990), pp. 3–14, gives an example. Normally such filters need a certain amount of memory, e.g. field memories, or are not suited for every noise level or are not adaptive to the local structure of the picture.

SUMMARY OF THE INVENTION

The present invention is directed to meeting the need for a method of noise reduction which needs only simple hardware and takes into account different noise levels and picture structures. The present invention applies to noise reduction systems of a type in which, for estimating a local noise value within a sliding window of a picture, the quadratic error between an unfiltered noisy input signal and the filtered input signal is computed and used for calculating a weighted average of the filtered and unfiltered input signal as output signal. In accordance with an aspect of the invention, the calculation of the weighted average includes also a global noise value whereby for computing the local noise value pixel difference signals of the window are calculated.

In accordance with a further feature of the filtering method embodying the invention, the filtering is carried out in two or more branches of different filter characteristics each having a weighted average output signal derived from the filtered input signals of each two consecutive branches, whereby for computing said local noise value in each of said branches additionally respective pixel difference signals between each two consecutive of said filtered input signals are used and for obtaining the final output signal that branch output signal is selected which has a minimum error compared to said input signal.

Noise reduction apparatus embodying the invention includes a first filter, a second filter and a third filter having a common input signal and a different kind of characteristic. A first control circuit is provided for controlling the weighting values of a first multiplier operating on said input signal and a second multiplier operating on the output signal of said first filter, whereby the outputs of these multipliers are combined in first adding means. A second control circuit is provided for controlling the weighting values of a third multiplier operating on the output signal of said first filter and a fourth multiplier operating on the output signal of said second filter and the outputs of these multipliers are combined in second adding means. A third control circuit is provided for controlling the weighting values of a fifth multiplier operating on the output signal of said second filter and a sixth multiplier is provided for operating on the output signal of said third filter, the outputs of these multipliers being combined in third adding means. A first subtraction means is provided to feed the difference signal between said input signal and the output signal of said first filter to said first control circuit and a second subtraction means feeds the difference signal between said input signal and the output signal of said second filter to said second control circuit. A third subtraction means feeds the difference signal between the output signal of said first filter and the output signal of said second filter to said second control circuit. A fourth subtraction means feeds the difference signal between said input signal and the output signal of said third filter to said third control circuit. A fifth subtraction means feeds the difference signal between the output signal of said second filter and the output signal of said third filter to said third control circuit. A further subtraction means feeds the respective difference signals between said input signal and the output signals of said adding means to a control and mixing circuit which selects an output signal of said adding means according to the minimum error derived from these difference signals and according to a global noise variance value, whereby for each of the branches said weighting values are derived from error signals calculated in the respective control circuit from said difference signals and from said global noise variance value.

BRIEF DESCRIPTION OF THE DRAWING

The foregoing and further features of the invention are illustrated in the accompanying drawing wherein.

DETAILED DESCRIPTION

Figure 1:
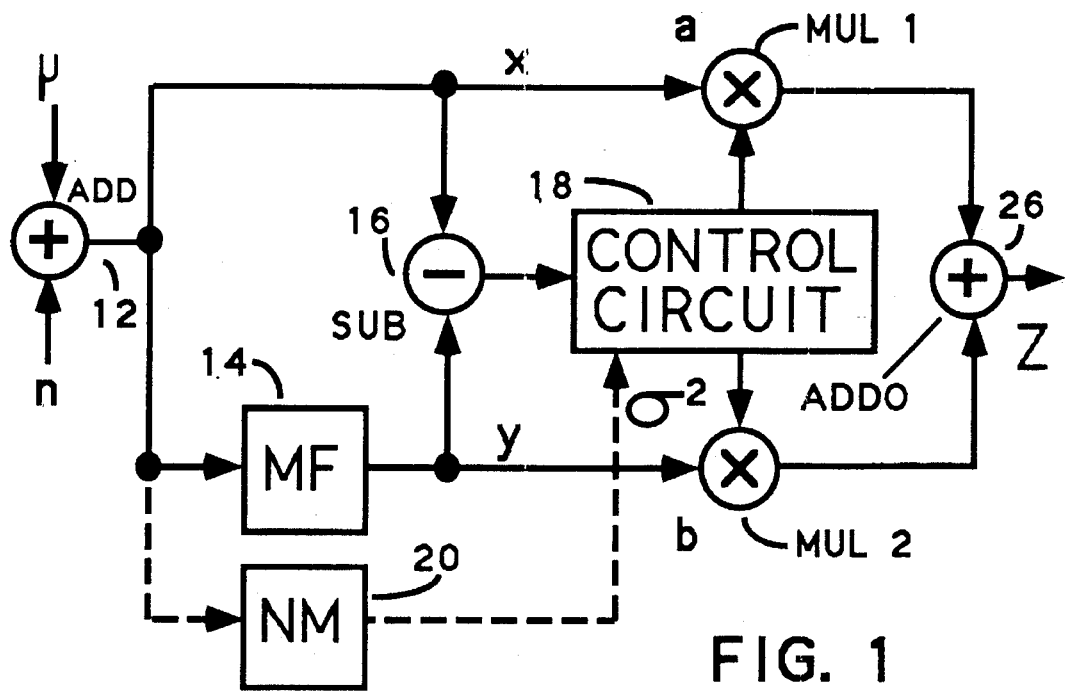
FIG. 1 is a block diagram of a first example of a noise reduction system embodying the invention.

Noise reduction systems embodying the present invention provide a number of significant advantages including (1) field processing i.e. without field memory; (2) few memories and simple hardware realization; (3) processing adaptive to any level of noise; and (4) processing adaptive to the local structure of the picture, i.e. detecting plain areas, edges and fine details so as to preserve the relevant information of the picture. In providing this noise reduction one my use a number of different filter types such as: (1) a linear low pass filter with different coefficients; (2) a median filter; (3) a linear filter in the direction of the edges (directional filter); (4) a directional median filter; (5) a weighted average of filters 1, 2, 3 and 4; and (6) filtering with one of the filters 1, 2, 3 and 4 with fixed threshold and local measure of picture activity by the Laplacian.

Before considering the details of overall filtering in the present invention, it is helpful first to briefly review the general properties of the filters noted. Median filters, for example, are more suitable to remove noise in plain areas than linear filters especially in the case of high frequency noise of high amplitude. Also, median filters preserve edges and linear filters do not. Directional filters are very efficient for preserving edges and picture accuracy while filtering slightly but efficiently enough. Median filters completely lose the fine textures (of a zone plate test picture, for example) and the only way to preserve them is to use a directional filter. Weighted averages of filters give good results but the weighting coefficients are not easy to adapt locally without correct noise estimation and can lead to hard switching and to the introduction of artifacts. Thresholds and local measures of activity give good results when adapted to the picture but they have to be combined with noise estimation on the whole picture.

As is apparent, no one of the general filtering methods noted above meets all of the needs for noise reduction in images. The present invention, however, provides a technique of noise reduction that is both globally and locally adaptive. In other words, noise reduction in the systems described herein adapts both to large features and to fine detail of displayed images.

As a brief overview of the noise reduction methods and apparatus of the present invention, a noisy input signal x is filtered with a restoration filter of median type to generate a filtered input signal y. The sum of the absolute differences between filtered and unfiltered signal is calculated for each position of a sliding window within the input signal, representing a local estimate of the noise to combined with a global measure of the input signal noise to compute by least squares regression two coefficients a and b which are respectively applied to the unfiltered and filtered signal to generate the output signal z=a*x+b*y.

Advantageously the only required prior information is the noise variance $\sigma^2$, assuming that the original signal $\mu$ is degraded by additive stationary noise n. The size of the local noise estimation window can be different from the size of the window used by the restoration filter, wherefore they can be adjusted independently for optimal performance.

The weighting coefficients a and b are made optimal in the sense that they are minimizing the quadratic error $\epsilon^2$ between the output signal z and the noise free original signal $\mu$. It is true that the original signal is not known at a receiver, but global noise statistics can be calculated at the receiver side (e.g. described in EP-A-92400785) and used for that optimization. Preferably a+b=1, so that no bias is introduced by the filtering. This solution usually performs slightly worse, but is rather simple to implement, no computational complexity need be added.

If, for a given image, the filtering tends to degrade the signal, a predominant weight will be given to the unfiltered signal x. Conversely, when the sum of differences is small and close to a reference value corresponding to the residue of the noise alone, the weight will be shifted to the filtered signal.

As will be seen from disclosed embodiments of the invention, the choice of the kind of restoration filter does heavily influence the merit of the inventive noise reduction. Therefore, advantageously different kind of filters can operate in parallel, whereby the kind of filter elected has to be locally adapted to the picture activity. That branch which results in a minimum error between the filtered and the unfiltered signal will be selected.

Considering now the first specific example of the invention, in the noise reduction system 10 of FIG. 1 noise n is added by adder 12 in a channel, e.g. a TV channel, to a noise free original signal $\mu$, e.g. a TV signal. The resulting noisy input signal x of the inventive apparatus, e.g. in a TV receiver or a VCR, is filtered with a restoration filter 14 of median type (MF) to generate a filtered input signal y. The difference $\Delta$ between signal x and signal y is calculated in a subtractor 16 (SUB) and fed to a control circuit 18 which forms from $\Delta$ the sum of the absolute differences between filtered and unfiltered input signal for each position of a sliding window within the input signal x, representing a local estimate of the noise. The global noise statistics can be calculated in a noise measurement circuit 20. The local noise estimate is combined in control circuit 18 with the global measure $\sigma^2$ of the input signal noise to compute (by least squares regression) two coefficients a and b which are respectively applied to the unfiltered and filtered signal to generate the output signal z=a*x+b*y. This can be done, as shown, by multiplying signal x in a first multiplier MUL 1 by factor a and by multiplying signal y in a second multiplier MUL 2 by factor b. The outputs of multipliers MUL1 and MUL 2 are added in adder 26, resulting in a noise-reduced output signal z.

Figure 4:
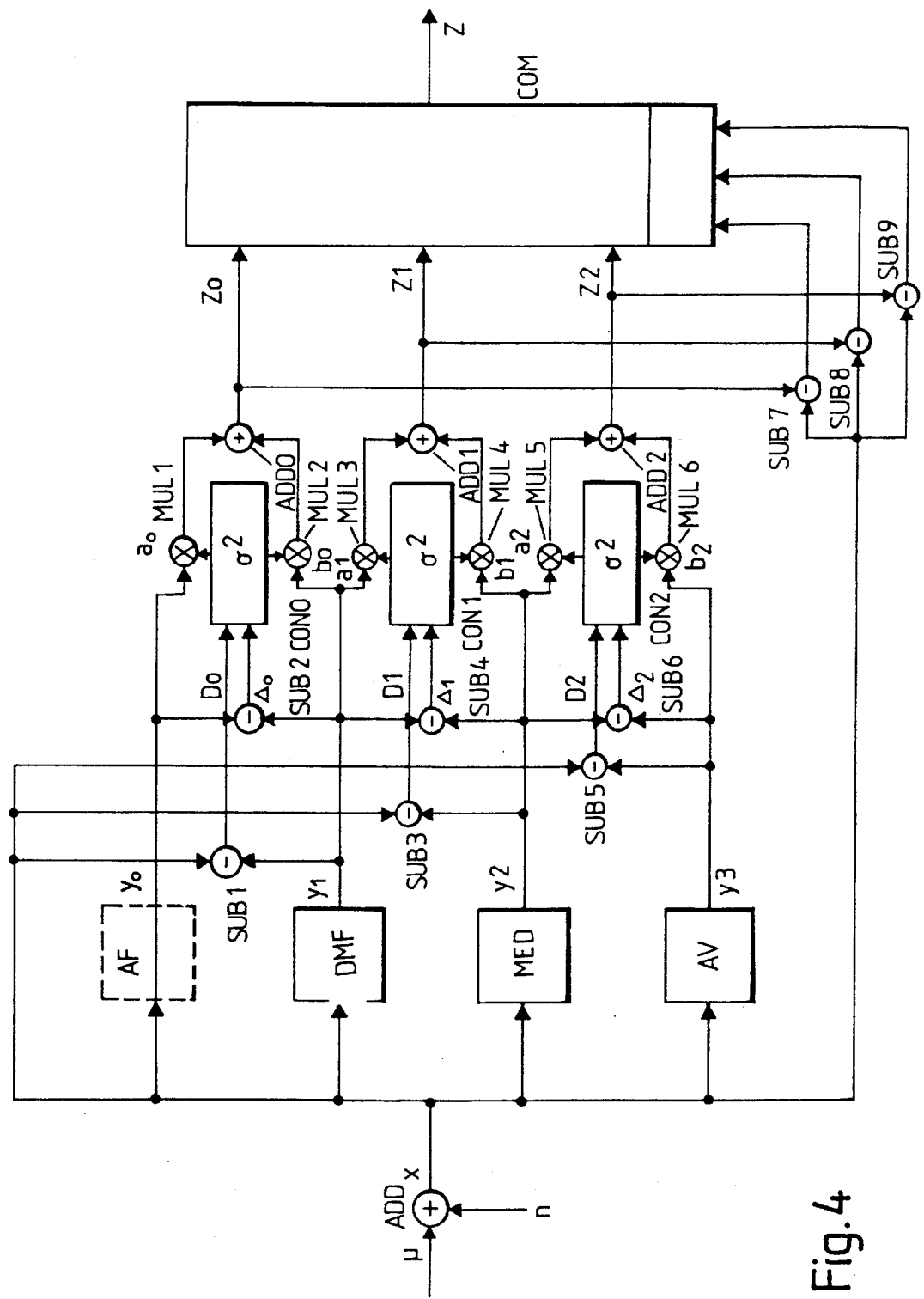
FIG. 4 is a block diagram illustrating a second example of a noise reduction system embodying the invention.

Because the kind of filter 14 (median filter) influences the resulting noise reduction and picture quality, advantageously different filter types can operate in parallel. Then the problem is, how to select the output of the best-fitting filter. In FIG. 4 three filters DMF, MED and AV of different kind are operating, whereby weighted averages of each two consecutive filter outputs are calculated.

Each average is obtained as in FIG. 4 by minimizing the squared error $\epsilon^2$ between the output signal z and the noise-free signal $\mu$. A respective filtered output signal $z_i$, i=0 to 2, is selected by examining the respective errors: the selected branch corresponds then to the minimum error. This method allows switching between filters depending on the statistical properties of the local filtered and unfiltered pictures.

Figure 2:
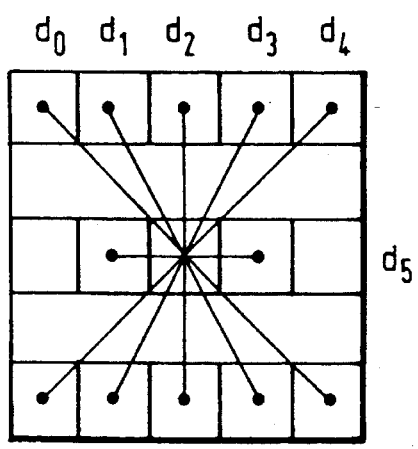
FIG. 2 is a spatial diagram illustrating filter-related directions in the picture.
Figure 3:
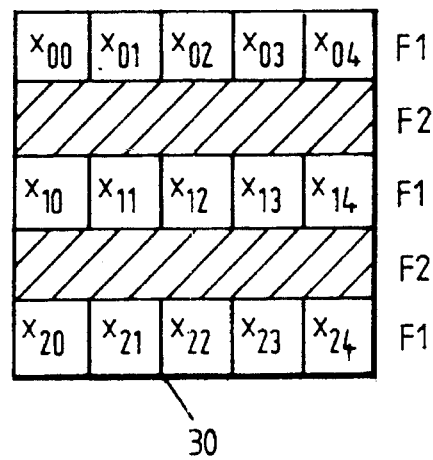
FIG. 3 spatial diagram illustrating a window for noise filtering.

The three restoration filters are: (1) DMF—directional median filter; (2) MED—median filter; and (3) AV—average. The sliding window 30 depicted in FIG. 3 has a size of 5 pixels by 3 lines. As the processing is not on a frame basis but on a field (F1; F2) basis, this size corresponds to a region of 5 by 5 pixels for the interlaced picture (lines of filed F1). The directional median filter DMF works as follows:

Let $x_{ji}$, j=0 to 2, i=0 to 4, be the pixels taken into account by window 30. The tested filter directions in FIG. 2 are called $d_i$, i=0 to 5. The related gradients are respectively estimated by:

$$g_0 = |x_{00} - x_{12}| + |x_{24} - x_{12}|;$$

$$g_1 = |x_{01} - x_{12}| + |x_{23} - x_{12}|;$$

$$g_2 = |x_{02} - x_{12}| + |x_{22} - x_{12}|;$$

$$g_3 = |x_{03} - x_{12}| + |x_{21} - x_{12}|;$$

$$g_4 = |x_{04} - x_{12}| + |x_{20} - x_{12}|;$$

$$g_5 = \tfrac{1}{2} * (|x_{10} - x_{12}| + |x_{11} - x_{12}| - |x_{12} - x| + |x_{14} - x_{12}|)$$

The selected direction is given by the smallest gradient. The respective output signals yl of filter DMF are median values:

$$m_0 = \text{median}(x_{11}, x_{12}, x_{24});$$

$$m_1 = \text{median}(x_{01}, x_{12}, x_{23});$$

$$m_2 = \text{median}(x_{02}, x_{12}, x_{22});$$

$$m_3 = \text{median}(x_{03}, x_{12}, x_{21});$$

$$m_4 = \text{median}(x_{04}, x_{12}, x_{20});$$

$$m_5 = \text{median}(x_{11}, x_{12}, x_{13});$$

If two or more of these directions result in a minimum gradient, the average of the respective signals is taken to generate the output $y_1$. Such multiple minimum gradients appear at less than 1% of pixels.

The output $y_2$ of filter MED is:

$y2 = \text{median } (xji)$
$0 \leq i \leq 4$ $0 \leq i < 2$

The output $y_3$ of filter AV is:

$$y3 = \frac{1}{15} * \sum_{\substack{0 \leq i \leq 4 \\ 0 \leq i \leq 2}} (xji)$$

In the example of FIG. 4 the: circuits ADD, DMF, SUB2, CON0, MUL1, MUL2 and ADD0 correspond to the circuits ADD, MF, SUB, CON, MUL1, MUL2 and ADD of FIG. 1. The input of filter DMF is also connected to a second filter MED and to a third filter AV and can also be connected to an additional filter AF which forms the output signal $y_0$ from the noisy input signal x. The input signal x is also fed to a first, a third and a fifth subtractor SUB1, SUB3 and SUB5. The output signal $y_1$, $y_2$ and $y_3$, respectively, of filter DMF, MED and AV, respectively, is subtracted in the subtractor SUB1, SUB2 and SUB3, respectively from the input signal x. The outputs $D_0$, $D_1$, and $D_2$, respectively, of these subtractors are each connected to a respective control circuit CON0, CON1 and CON2. The difference signal $\Delta_0$, $\Delta_1$ and $\Delta_2$, respectively, calculated in a second, a fourth and a sixth subtractor SUB2, SUB4 and SUB6, respectively, between signals $y_0$ (=x) and $y_1$, $y_1$ and $y_2$, and $y_2$ and $y_3$, respectively, are also fed to the according control circuit CON0, CON1 and CON2. If filter AF is omitted, SUB1 can also be omitted because $D_0 = \Delta_0$. The first control circuit CON0 controls the coefficient $a_0$ of a first muliplier MUL1 which multiplies signal $y_0$ and the coefficient $b_0$ of a second multiplier MUL2 which multiplies signal $y_1$. The outputs of these multipliers are added in adder ADD0, forming output signal $z_0$. The second control circuit CON1 controls the coefficient $a^1$ of a third multiplier MUL3 which multiplies signal $y_1$ and the coefficient $b_1$ of a fourth multiplier MUL4 which multiplies signal $y_2$. The outputs of these multipliers are added in adder ADD1, forming output signal $z^1$. The third control circuit CON2 controls the coefficient $a_2$ of a fifth multiplier MUL5 which multiplies signal $y_2$ and the coefficient $b_2$ of a sixth multiplier MUL6 which multiplies signal $y_3$. The outputs of these multipliers are added in adder ADD2, forming output signal $z_2$. In a seventh, eighth and ninth subtractor SUB7, SUB8 and SUB9, respectively, the difference signals between the according output signals $z_0$, $z_1$ and $z_2$ and the input signal x (error on window) are calculated. These subtractor output signals are used in a fourth control and mixing circuit COM for connecting one of the output signals $z_0$, $z_1$ and $z_2$ with output z, according to the minimum error.

For calculating the minimum error in the control circuits, the known noise variance $\sigma_2$, as described for FIG.1, is used. Hard or soft switching can be made in control circuit COM. The quadratic errors to be minimized in CON0, CON1 and CON2 are for i=0 to 2:

$$\epsilon_i = 1/N_R * \sum_R (a_i y_i + b_i y_{i+1} - \mu)^2 \qquad (1)$$

$$= 1/N_R * \sum_R (z_i - \mu)^2$$

$$= 1/N_R * S_{z_i - \mu, z_i - \mu}$$

where NR is the total number of pixels in the region R which corresponds to the sliding window 30. The notation $S_{u,v}$ is used to designate a sum of squares over the region R and is defined as:

$$S_{u,v} = \sum_R u(k,l)v(k,l),$$

where k and l are elements of R and u and v stand either for x, $Y_i$, $z_i$ or $\mu$. $\mu$ is not known so that $Sy_i$, $\mu$ cannot be computed in such a way. Instead, use is made of an a priori knowledge of the noise statistics.

It is assumed for simplicity that ai and bi are constant over the region R. Then (equation 1):

$$N_R \epsilon_i = a_i^2 \sum_R y_i^2 + b_i^2 \sum_R y_i + l^2 + \sum_R \mu^2 +$$
$$2a_i b_i \sum_R y_i y_i + l - 2a_i \sum_R y_i \mu - 2b_i \sum_R y_{i+l} \mu$$
$$= a_i^2 S_{i, Y_i} + b_i^2 Sy_{i+l, Y_{i+l}} + S\mu,\mu +$$
$$2a_i b_i Sy_i, y_{i+l} - 2a_i Sy_i, \mu - 2b_i Sy_{i+l, \mu}$$

The constraint is $a_i + b_i = 1$. The minimization with this constraint leads to the following system bf equations:

$$a_i Sy_i y_i + b_i Sy_i y_{i+1} + \lambda_i = Sy_i \mu$$

$$a_i Sy_i y_{i+1} + b_i Sy_{i+1} y_{i+1} + \lambda_i = Sy_i \mu$$

where $\lambda_i$ is a Lagrange multiplier.
The solution is:

$$a_i = (Sy_i, \mu - Sy_{i+1}, \mu - Sy_i, y_{i+1} + Sy_{i+1}, y_{i+1})/\Delta_i$$

$$b_i = (-Sy_i, \mu + Sy_{i+1}, \mu - Sy_i y_{i+1} + Sy_i, y_{i+1} + Sy_i, y_i)/\Delta_i$$

where $\Delta_i = Sy_i, y_i - 2Sy_i, y_{i+1} + Sy_{i+1}, y_{i+1}$, $y_{i+1} - Sy_i - y_{i+1}, y_i - y_{i+1}$
Because $\mu = x-n$, $Sy_i$, $\mu = SY_i$, $x - Sy_i$, $n = Sx$, $y_i - S\mu_i'$, $n - Sn_i'$, $n = Sx$, $y_i - \rho_i \rho^2$ where for each filter $F_i$: $i_2'$ is the filtered noise free signal, $n_i'$ is the filtered noise, $\rho^2 = E(n^2(k, l))$ is the known noise variance and $\rho_i = E(n(k, l) n_i'(k, l))$ is the residual noise correlation coefficient after filtering with $F_i$ (i.e. $\rho=1$: no filtering; $\rho=0$: full filtering, no noise left).

The assumption of stationary noise allows here easy estimation of these coefficients $\rho_i$. But if they are known for another kind of noise, it is possible to extend the filter to less restrictive conditions. Using these coefficients, $a_i$ and $b_i$ can be estimated to:

$$a_i = (Sx, y_i - Sx, y_{i+1} - Sy_i, y_{i+1} + Sy_{i+1}, y_{i+1} - \rho_i \sigma^{2+\rho}_{i+1} \sigma^2)/\Delta_i$$

$$b_i = (-Sx, y_i + Sx, y_{i+1} - Sy_i, y_{i+1} + Sy_i, y_i + \rho_i \sigma^{2-\rho}_{i+1} \sigma^2)/\Delta_i$$

or $$a_i = (Sx - y_{i+1}, y_i - y_{i+1} - \sigma^2 (\rho^2_i - \rho_{i+1} + 1))/Sy_i - y_{i+1}, y_i - y_{i+1}$$

$$b_i = (Sy_i - x, y_i - y_{i+1} \sigma^2 (\rho_i - \rho_{i+1} + 1))/Sy_i - y_{i+1}, y_i - y_{i+1}$$

Therefore ai and bi are known once the correlation term $Sx-y_{i+1}, y_i - y_{i+1}$ has been computed within the control circuits CON0, CON1 and CON2 for the current position of the window 30. The output signals $D_0$, $D_1$ and $D_2$, respectively, of the according subtracters SUB1, SUB2 and SUB3 are used for computing these correlation terms. For good stability of the system it is required that $z_i$ is always between $y_i$ and $y_{i+1}$, i.e. $0 \leq a_i \leq 1$.

For selecting in control and mixing circuit COM the optimum filter branch, it is possible to derive from the values of a and b the quadratic errors:

$$N_R \epsilon_i = Sz_i - \mu, z_i - \mu = Sz_i, z_i - 2Sz_i, \mu + S\mu, \mu$$

where $$S\mu, \mu = Sx-n, \mu = Sx, \mu - Sn, \mu = Sx, x - Sx, n = Sx, x - Sn, n \; S\mu, v = Sx, x - \sigma^2$$

and $$Sz_i, \mu=Sz_iy_i+b_iy_{i+1}, \mu=a_iSy_i, \mu+b_iSY_{i+1}, \mu=a_iSx, y_i-a_i{}^p{}_i\sigma^2+b_iSx, y_{i+1}-b_i{}^p{}_{i+1}\sigma^2=Sx, z_i-\sigma^2(a_i{}^p{}_i+b_i{}^p{}_{i+1}).$$

Therefore $$N_R \epsilon_i=Sz_i, z-2Sx, z_i+2\sigma^2(a_i{}^p{}_i+b_i{}^p{}_{i+1})+Sx, x-\sigma^2Sz_i-x, z^i-x+\sigma^2(2a_i{}^p{}_i 2b_i{}^p{}_{i+1}-1).$$

Figure 5:
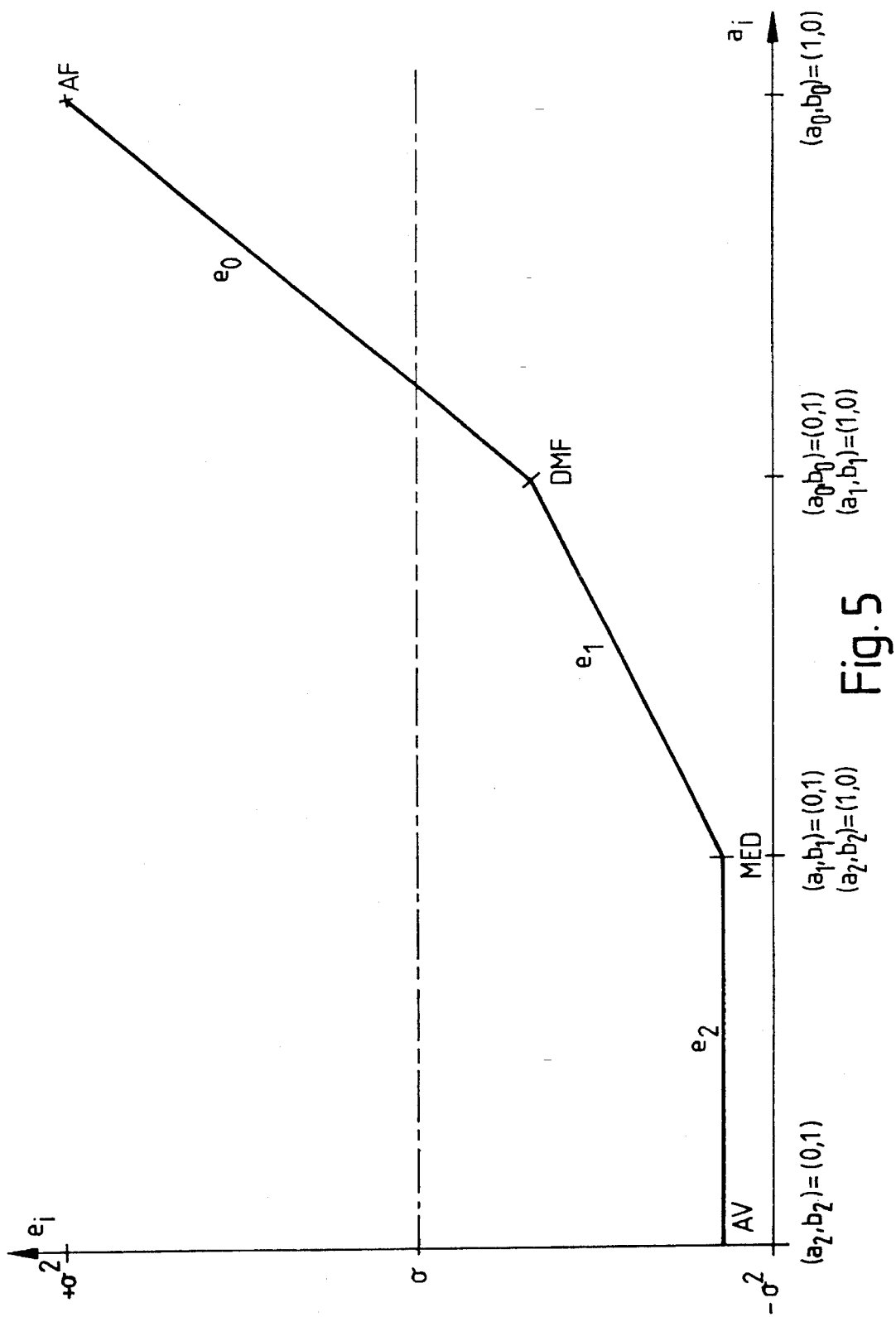
FIG. 5 is a diagram illustrating correction terms for the comparison of the filters errors.

The correction term $e_i=\sigma^2(2a_i{}^p{}_i+2b_i{}^p{}_{i+1}-1)$ can be explained by the fact that the more a given filter smoothes the picture, the higher the term $Sz_i-x$, $z_i-x$ will be. Therefore, before the terms generated by filters of different efficiencies can be compared, they must be compensated by a specific kind of function. The graph of this function is given in FIG. 5 to illustrate this effect when using the current filter type (AV, MED, DMF, AF) parameters. The correction term $e_i$ is shown in relation to coefficient $a_i$.

The filter AV of type 'average' is well suited for plain areas. The two median filters DMF and MED preserve the edges and a good resolution. To improve the contrast, enhancement processing can be implemented after the noise reduction processing. If the window 30 is enlarged, also other picture degradations can be reduced, for example blurs and stripes. Advantageously due to field processing no blurs are introduced on moving objects.

In order to reduce the complexity and the costs of the hardware implementation it is possible to modify the described filters in the following ways:

- the size of the window for error estimation can be reduced to 5 pixels by 1 line: therefore no additional line memories will be needed (only 2 line memories for the input filters);
- filter DMF can be a directional median filter with only four directions instead of six: $d_0$, $d_2$, $d_4$ and $d_5$;
- filter MED can be a median with a window of three pixels by three lines;
- limitation of the number of bits for the computation of the weighting coefficients (4 bits, for example).

The foregoing simplifications have the following influences on the processed pictures:

- if the size of the estimation window is smaller, the simplified filter will tend to filter more than the non simplified one, particularly when there are local horizontal line structures because no care is taken of the previous and following lines even if they are very different in their local structure;
- simplifications of the input filters do not create too many degradations on the output signal since the filtering is adaptive and always the best solution between the three outputs $z_0$, $z_1$ and $z_2$ is chosen;
- the reduction of the number of bits of the weighting coefficients creates no significant loss of accuracy: 1 or 2 units for an amplitude range of 256.

The big advantage of this new filter is to allow with very few memories and simple hardware implementation a noise filtering that is adaptive simultaneously locally and globally.

Because of this double ability of adaptation in accordance with the invention, the filtering is optimized even with simple filters at the input.

The inventive noise reduction system is of general utility and may be used in any video or audio processing devices, e.g. TV receivers and VCR's.

What is claimed is:

1. A method for noise reduction of a digital video input signal, comprising the steps of:

filtering said digital video input signal by applying said digital video input signal in parallel to at least three circuit branches, a first of said circuit branches containing no filter, the remaining branches containing respective filters of differing filter types;

estimating for each said circuit branch within a sliding window in a current picture of said digital video input signal a local noise value from the quadratic error between the filter output signals of each two consecutive branches by calculating pixel difference signals within said window;

forming for each branch a weighted average of the two signals used in each of said two consecutive branches for estimating said quadratic error, thereby taking into account for the weight a global noise value and the local noise value for the branch; and selecting a final noise reduced video output signal from said weighted averages of said branches in accordance with a minimum error between said weighted averages of said branches compared to said digital video input signal.

2. A method according to claim 1, wherein in the step of selecting said final noise reduced video output signal said minimum error is determined by first developing an error signal between said video input signal and each weighted average of each branch to provide a plurality of branch error signals and a correction term related to the respective filter characteristic is added to each of said branch error signals.

3. A method according to claim 1 wherein in the step for forming said weighted average for each branch, said two signals used in each of said two consecutive branches are weighted by respective weighting factors and the sum of the two weighting factors for said weighted average is 1.

4. A method according to claim 1 wherein in the step for forming said weighted average for each branch, said two signals used in each of said two consecutive branches are weighted by respective weighting factors and the sum of the two weighting factors for said weighted average is 1; and wherein the one weighting factor related to said unfiltered input signal of the two weighting factors for said weighted average is in the range 0 to 1 and wherein the respective one of each two weighting factors for said weighted average is in the range 0 to 1.

5. A method according to claim 1 wherein in the step for forming said weighted average for each branch, said two signals used in each of said two consecutive branches are weighted by respective weighting factors and the respective one of each two weighting factors for said weighted average is in the range 0 to 1 and wherein at minimum one weighting factor related to said unfiltered input signal of the two weighting factors for said weighted average is in the range 0 to 1 and wherein two of the following filter characteristics are used in said branches: directional median filter, median filter, average, whereby for said directional median filter at minimum four directions are evaluated in said sliding window.

6. A method according to claim 1 wherein said sliding window has a size of five pixels by one to five lines when related to a frame basis.

7. A method according to claim 2 wherein in the step for forming said weighted average for each branch, said two signals used in each of said two consecutive branches are weighted by respective weighting factors and the sum of the two weighting factors for said weighted average is 1.

8. A method according to claim 3 wherein the one weighting factor related to said unfiltered input signal of the two weighting factors for said weighted average is in the range 0 to 1.

9. A method according to claim 2 wherein in the step for forming said weighted average for each branch, said two signals used in each of said two consecutive branches are weighted by respective weighting factors and the sum of the two weighting factors for said weighted average is 1; and wherein the one weighting factor related to said unfiltered input signal of the two weighting factors for said weighted average is in the range 0 to 1 and wherein the respective one of each two weighting factors for said weighted average is in the range 0 to 1.

10. A method according to claim 2 wherein in the step for forming said weighted average for each branch, said two signals used in each of said two consecutive branches are weighted by respective weighting factors and the respective one of each two weighting factors for said weighted average is in the range 0 to 1 and wherein at minimum one weighting factor related to said unfiltered input signal of the two weighting factors for said weighted average is in the range 0 to 1 and wherein at least two of the following filter characteristics are used in said branches: directional median filter, median filter, average, whereby for said directional median filter at minimum four directions are evaluated in said sliding window.

11. A method according to claim 3 wherein the respective one of each two weighting factors for said weighted average is in the range 0 to 1 and wherein at minimum one weighting factor related to said unfiltered input signal of the two weighting factors for said weighted average is in the range 0 to 1 and wherein at least two of the following filter characteristics are used in said branches: directional median filter, median filter, average, whereby for said directional median filter at minimum four directions are evaluated in said sliding window.

12. A method according to claim 2 wherein said sliding window has a size of five pixels by one to five lines when related to a frame basis.

13. A method according to claim 3 wherein said sliding window has a size of five pixels by one to five lines when related to a frame basis.

14. A method according to claim 4 wherein said sliding window has a size of five pixels by one to five lines when related to a frame basis.

15. A method according to claim 5 wherein said sliding window has a size of five pixels by one to five lines when related to a frame basis.

16. A method according to claim 10 wherein said sliding window has a size of five pixels by one to five lines when related to a frame basis.

17. A method according to claim 7 wherein said sliding window has a size of five pixels by one to five lines when related to a frame basis.

18. A method according to claim 8 wherein said sliding window has a size of five pixels by one to five lines when related to a frame basis.

19. A method according to claim 9 wherein said sliding window has a size of five pixels by one to five lines when related to a frame basis.

20. A method according to claim 11 wherein said sliding window has a size of five pixels by one to five lines when related to a frame basis.

21. Digital video signal noise reduction apparatus, comprising:

a first filter, a second filter and a third filter having a common input signal terminal to which said digital video input signal is applied, each said filter being of a different filter type;

a first control circuit controlling the weighting values of a first multiplier operating on said input signal and a second multiplier operating on the output signal of said first filter and first adding means for combining the outputs of said first and second multipliers;

a second control circuit controlling the weighting values of a third multiplier operating on the output signal of said first filter and a fourth multiplier operating on the output signal of said second filter, and second adding means for combining the outputs of said third and fourth multipliers;

a third control circuit controlling the weighting values of a fifth multiplier operating on the output signal of said second filter and a sixth multiplier operating on the output signal of said third filter, and third adding means for combining the outputs of said fifth and sixth multipliers;

first subtraction means which feed the difference signal between said input signal and the output signal of said first filter to said first control circuit;

second subtraction means which feed the difference signal between said input signal and the output signal of said second filter to said second control circuit;

third subtraction means which feed the difference signal between the output signal of said first filter and the output signal of said second filter to said second control circuit;

fourth subtraction means which feed the difference signal between said input signal and the output signal of said third filter to said third control circuit;

fifth subtraction means which feed the difference signal between the output signal of said second filter and the output signal of said third filter to said third control circuit;

further subtraction means which feed the respective difference signals between said input signal and the output signals of said first, second and third adding means to a control and mixing circuit which selects an output signal of said adding means according to the minimum error derived from difference signals produced by said further subtraction means and according to a global noise variance value, whereby for each of the branches weighting values are derived from error signals calculated in the respective control circuit from said difference signals and from said global noise variance value, said weighting values being weighting values of the first to sixth multiplier.

22. Apparatus according to claim 21, wherein said first filter is a directional median filter wherein at minimum four directions are evaluated and said second filter is a median filter and said third filter is an averaging filter.

23. Video signal processing apparatus for providing noise reduction of a digital video input signal, comprising:

circuit means for filtering said digital video input signal by applying said digital video input signal in parallel to at least three circuit branches, a first of said circuit branches containing no filter, the remaining branches containing respective filters of differing filter types;

circuit means for estimating for each said circuit branch within a sliding window in a current picture of said digital video input signal a local noise value from the quadratic error between the filter output signals of each two consecutive branches by calculating pixel difference signals within said window;

circuit means for forming for each branch a weighted average of the two signals used in each of said two consecutive branches for estimating said quadratic error, thereby taking into account for the weight a global noise value and the local noise value for the branch; and circuit means for selecting a final noise reduced video output signal from said weighted averages of said branches in accordance with a minimum error between said weighted averages of said branches compared to said digital video input signal.

* * * * *